(12) United States Patent
Sung (10) Patent No.: US 8,759,827 B2
(45) Date of Patent: Jun. 24, 2014

(54) ORGANIC LIGHT EMITTING DIODE ILLUMINATING DEVICE

(71) Applicant: Ultimate Image Corporation, Miaoli (TW)

(72) Inventor: Chih-Feng Sung, Miaoli (TW)

(73) Assignee: Ultimate Image Corporation, Mialoi (TW)

( * ) Notice: Subject to any disclaimer, the term of this patent is extended or adjusted under 35 U.S.C. 154(b) by 0 days.

(21) Appl. No.: 13/898,606

(22) Filed: May 21, 2013

(65) Prior Publication Data

US 2013/0313533 A1    Nov. 28, 2013

(30) Foreign Application Priority Data

May 28, 2012   (TW) .............................. 101118952 A (51) Int. Cl.
*H01L 29/08*   (2006.01)
*H01L 27/32*   (2006.01)

(52) U.S. Cl.
CPC .................................. *H01L 27/3202* (2013.01)
USPC ........................................................... 257/40

(58) Field of Classification Search
CPC .......................... H01L 27/3202; H01L 27/3206
USPC ............................................................ 257/40
See application file for complete search history.

(56) References Cited

U.S. PATENT DOCUMENTS

2005/0170551 A1*   8/2005   Strip ............................... 438/88

* cited by examiner

*Primary Examiner* — Zandra Smith
*Assistant Examiner* — Paul Patton
(74) *Attorney, Agent, or Firm* — Trop, Pruner & Hu, P.C.

(57) ABSTRACT

An organic light emitting diode (OLED) illuminating device includes a substrate, first and second electrode units and a light emitting structure. The first electrode unit is disposed on the substrate, the light emitting structure is disposed on the first electrode unit, and the second electrode unit is disposed on the light emitting structure. The light emitting structure includes a patterned organic light emitting layer having blue light emitting zones and yellow light emitting zones that are spaced apart from each other, that are arranged on the same plane and that are electrically insulated from each other. An area of the blue light emitting zones is larger than that of the yellow light emitting zones.

13 Claims, 9 Drawing Sheets

ORGANIC LIGHT EMITTING DIODE ILLUMINATING DEVICE

CROSS-REFERENCE TO RELATED APPLICATION

This application claims priority of Taiwanese Application No. 101118952, filed on May 28, 2012.

BACKGROUND OF THE INVENTION

1. Field of the Invention

The invention relates to an illuminating device, more particularly to an organic light emitting diode illuminating device.

2. Description of the Related Art

Figure 1:
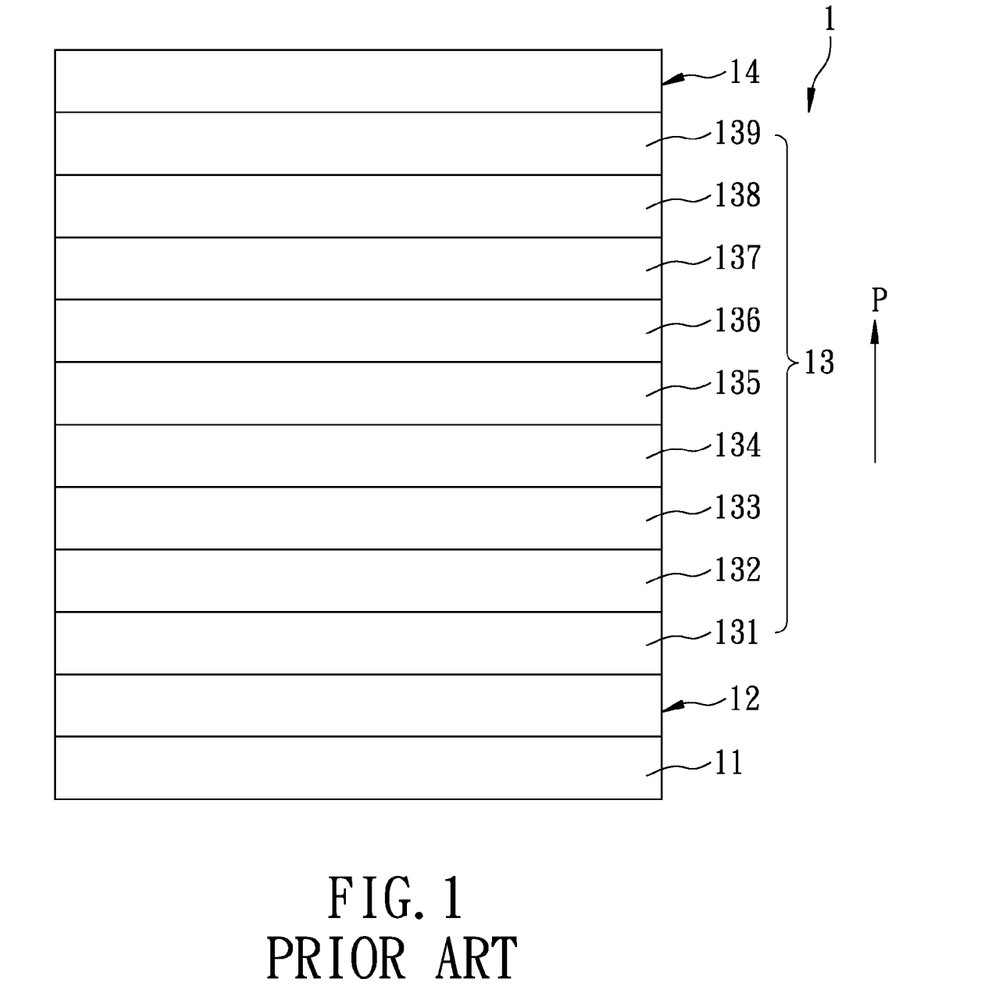
FIG. 1 is a schematic side view of a conventional OLED illuminating device.

Referring to FIG. 1, a conventional organic light emitting diode (abbreviated as OLED hereinafter) illuminating device 1 is shown to include a transparent substrate 11, an anode layer 12 (such as an ITO transparent conductive layer) formed on the transparent substrate 11, an organic light emitting structure 13, and a cathode layer 14 formed on the organic light emitting structure 13.

The organic light emitting structure 13 includes a hole injection layer 131, a first hole transfer layer 132, a blue light emitting layer 133 that is made of a blue light emitting material, a first electron transfer layer 134, a charge generation layer 135, a second hole transfer layer 136, a yellow light emitting layer 137 that is made of a yellow light emitting material, a second electron transfer layer 138, and an electron injection layer 139 which are stacked sequentially along a direction P as shown in FIG. 1.

The conventional OLED illuminating device 1 generates white light by mixing the generated blue light from the blue light emitting layer 133 with the generated yellow light from the yellow light emitting layer 137. However, the total thickness of the conventional OLED illuminating device 1, which is composed of at least 11 layers, is relatively large and results in a low production yield, which increases the production cost. Moreover, the blue light emitting material of the blue light emitting layer 133 has shorter life compared to the yellow light emitting material of the yellow light emitting layer 137, thereby generating chromatic shift problems of the conventional OLED illuminating device after being in use for a long period of time. Furthermore, chrominance of the illuminated light of the conventional OLED illuminating device 1 is determined by the blue and yellow light emitting materials which are adopted in the respective blue and yellow light emitting layers 133 and 137. Therefore, once the blue and yellow light emitting materials are chosen, chrominance of the illuminated light of the conventional OLED illuminating device 1 is then determined and cannot be adjusted.

SUMMARY OF THE INVENTION

Therefore, the object of the present invention is to provide an OLED illuminating device that may alleviate the aforesaid drawbacks of the prior art.

Accordingly, an OLED illuminating device of the present invention includes:
 a substrate;
 a first electrode unit disposed on the substrate;
 a light emitting structure disposed on the first electrode unit; and
 a second electrode unit disposed on the light emitting structure;
 wherein the light emitting structure includes a patterned organic light emitting layer having a plurality of blue light emitting zones and yellow light emitting zones that are spaced apart from each other, that are arranged on the same plane and that are electrically insulated from each other, a projected area occupied by the blue light emitting zones on the substrate being larger than that occupied by the yellow light emitting zones on the substrate.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 2:
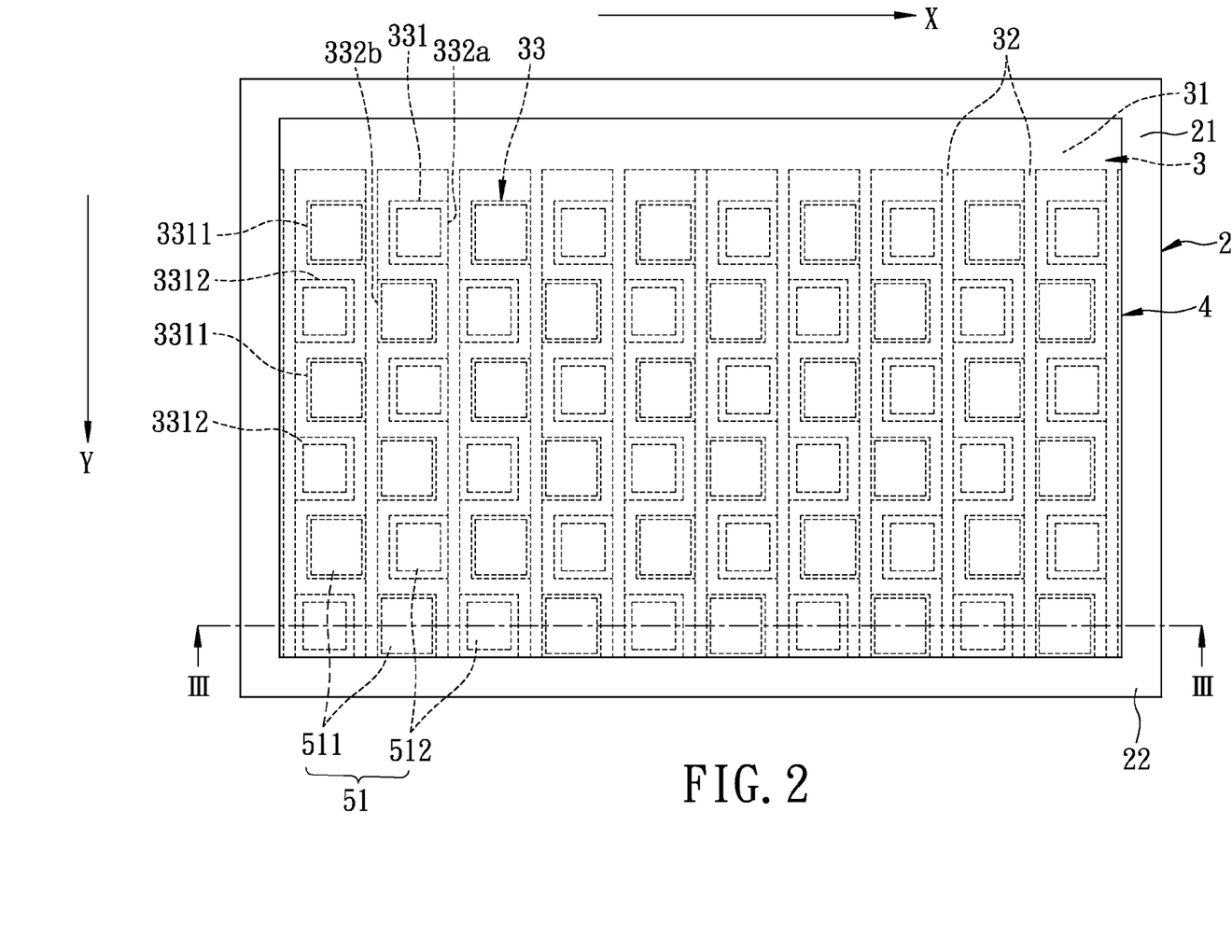
FIG. 2 is a schematic top view of the first preferred embodiment of an OLED illuminating device according to the present invention.
Figure 3:
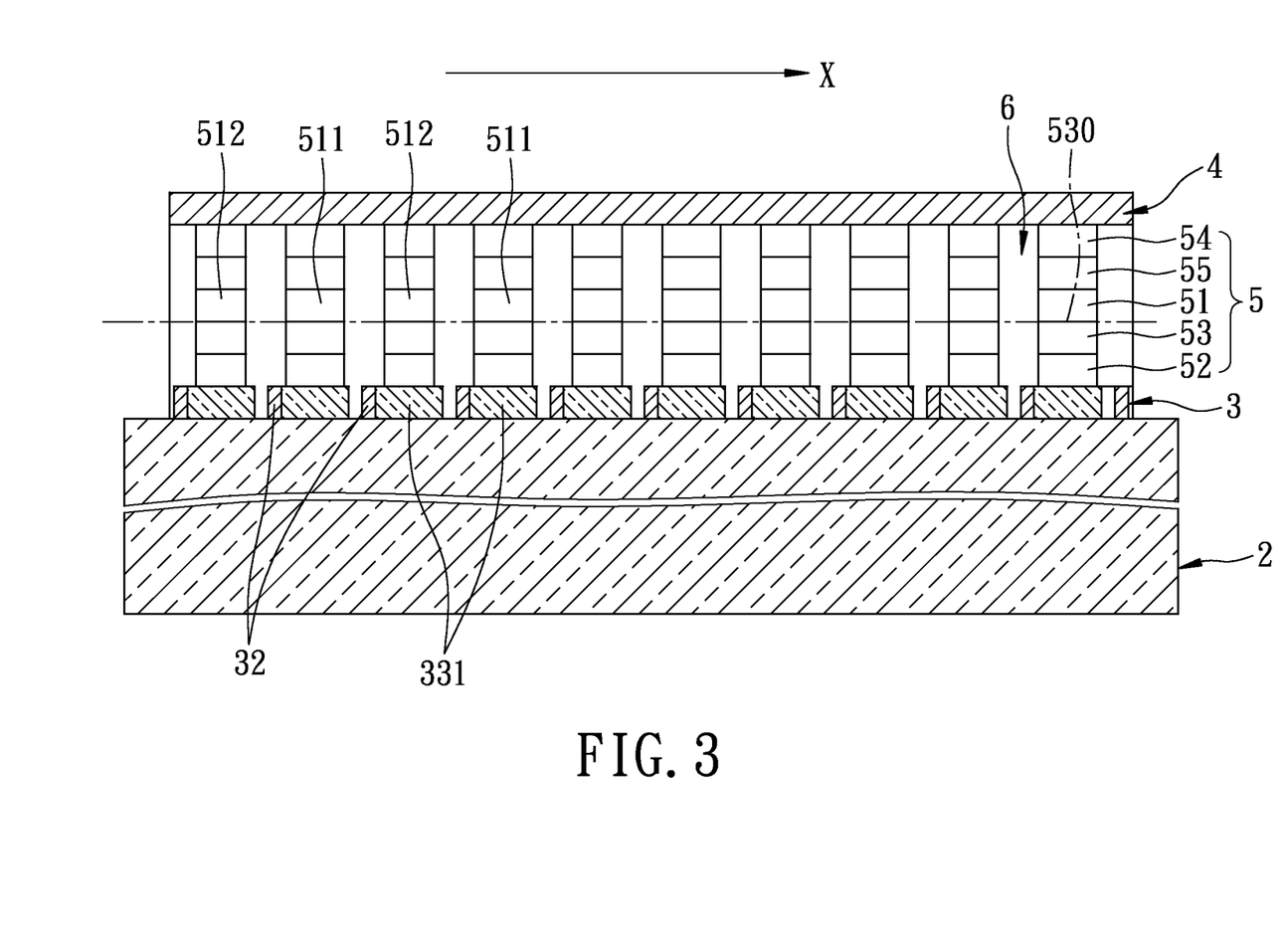
FIG. 3 is a fragmentary sectional view of the first preferred embodiment taken along line in FIG. 2.

Referring to FIGS. 2 and 3, the first preferred embodiment of an OLED illuminating device according to the present invention is shown to include a substrate 2, a first electrode unit 3 disposed on the substrate 2, a light emitting structure 5 disposed on the first electrode unit 3, and a second electrode unit 4 disposed on the light emitting structure 5.

The substrate 2 has a first side portion 21 and a second side portion 22 opposite to each other. In this preferred embodiment, the substrate 2 is configured to be transparent.

The light emitting structure 5 includes a patterned organic light emitting layer 51, a patterned hole injection layer 52 that is disposed between the first electrode unit 3 and the patterned organic light emitting layer 51, a patterned hole transfer layer 53 that is disposed between the patterned organic light emitting layer 51 and the patterned hole injection layer 52, a patterned electron injection layer 54 that is disposed between the second electrode unit 4 and the patterned organic light emitting layer 51, and a patterned electron transfer layer 55 that is disposed between the patterned organic light emitting layer 51 and the patterned electron injection layer 54. The patterned organic light emitting layer 51, the patterned hole injection layer 52, the patterned hole transfer layer 53, the patterned electron injection layer 54 and the patterned electron transfer layer 55 have mutually corresponding patterns.

The patterned organic light emitting layer 51 has a plurality of blue light emitting zones 511 and yellow light emitting zones 512 that are spaced apart from each other, that are arranged on the same plane (e.g., a top surface 530 of the patterned hole transfer layer 53) and that are electrically insulated from each other by an insulating material 6. A projected area occupied by the blue light emitting zones 511 on the substrate is larger than that occupied by the yellow light emitting zones 512 on the substrate 2. In this preferred embodiment, a projected area occupied by each of the blue light emitting zones 511 on the substrate 2 is larger than that occupied by each of the yellow light emitting zones 512 on the substrate 2. The blue light emitting zones 511 and the yellow light emitting zones 512 of the patterned organic light emitting layer 51 are arranged in a two-dimensional (2-D) array. In this embodiment, the blue light emitting zones 511 and the yellow light emitting zones 512 are arranged alternately in a checkerboard pattern.

The first and second electrode units 3 and 4 are configured as anode and cathode layers, respectively. In this embodiment, the first electrode unit 3 includes a primary bus line 31, a plurality of secondary bus lines 32, and a patterned transparent conductive layer 33. The primary bus line 31 is formed on the first side portion 21 of the substrate 2. The secondary bus lines 32 are electrically connected to the primary bus line 31, extend from the primary bus line 31 toward the second side portion 22 of the substrate 2 along a column direction Y of the 2-D array, and are spaced apart from each other along a row direction X of the 2-D array by the insulating material 6. The patterned transparent conductive layer 33 has a plurality of groups of electrode zones 331 that electrically connect the blue light emitting zones 511 and the yellow light emitting zones 512 of the patterned organic light emitting layer 51 to the secondary bus lines 32. The electrode zones 331 in each of the groups are arranged in the column direction Y between a corresponding adjacent pair of the secondary bus lines 32 and are spaced apart from each other by the insulating material 6. In this preferred embodiment, each of the groups of the electrode zones 331 includes a plurality of first electrode zones 3311 and a plurality of second electrode zones 3312 that are alternately arranged along the column direction Y. The first electrode zones 3311 are electrically coupled to one of the secondary bus lines 32 in the corresponding adjacent pair at one side 332a of the electrode zones 3311, and the second electrode zones 3312 are electrically coupled to the other one of the secondary bus lines 32 in the corresponding adjacent pair at one side 332b of the electrode zones 3312 that is opposite to the side 332a of the electrode zones 3311 in the row direction X of the 2-D array.

By forming the blue and yellow light emitting zones 511 and 512 on the same plane, overall thickness of the light emitting structure 5 is decreased, so as to improve the production yield and to lower the production cost. In addition, the larger projected area of the blue light emitting zones 511 of the patterned organic light emitting layer 51 results in lower current density thereof during operation, so as to lengthen the service life of the blue light emitting zones 511 and to alleviate the chromatic shift problem commonly encountered by the OLED light illuminating device after working for a long period of time.

Figure 4:
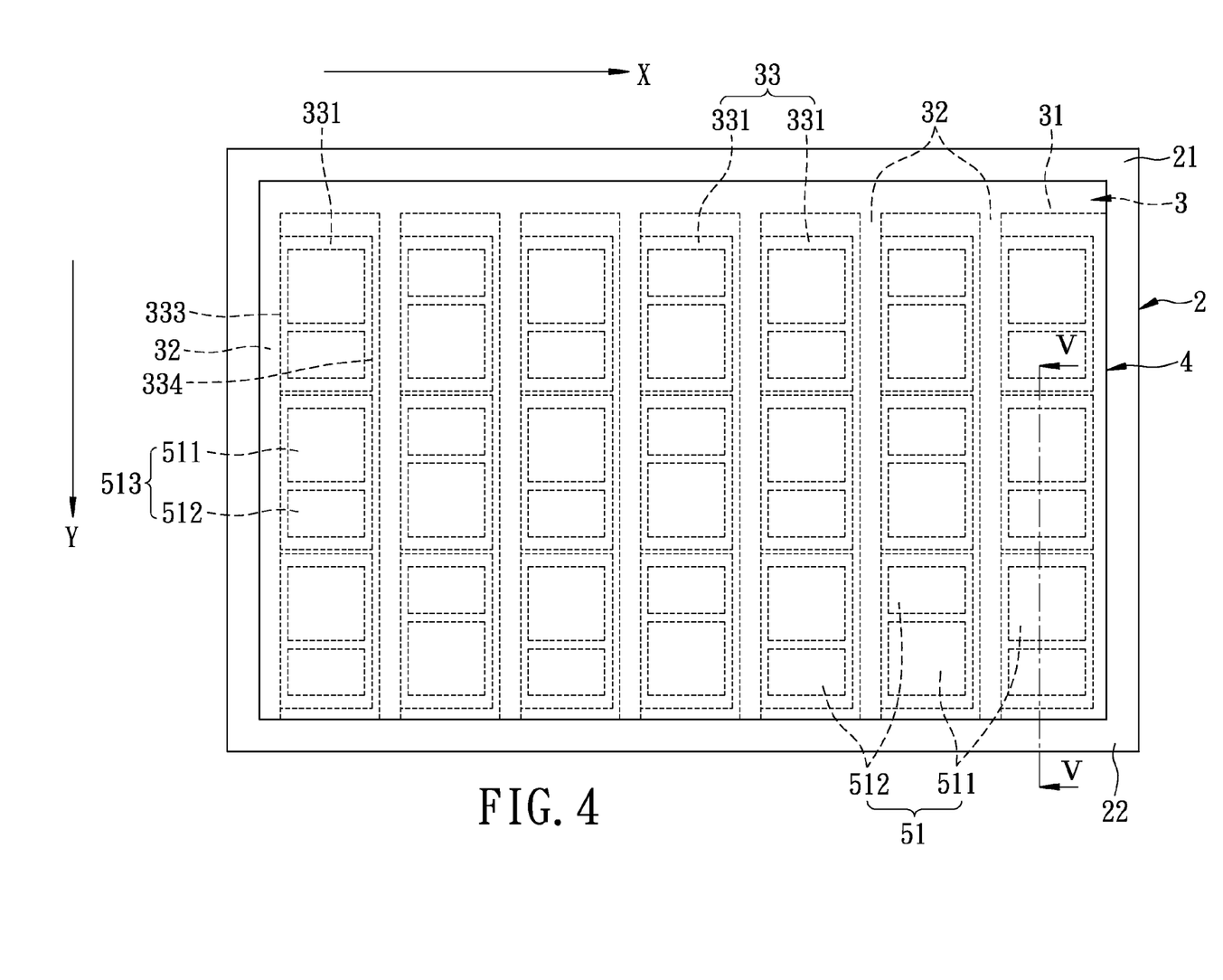
FIG. 4 is a schematic top view of the second preferred embodiment of the OLED illuminating device.
Figure 5:
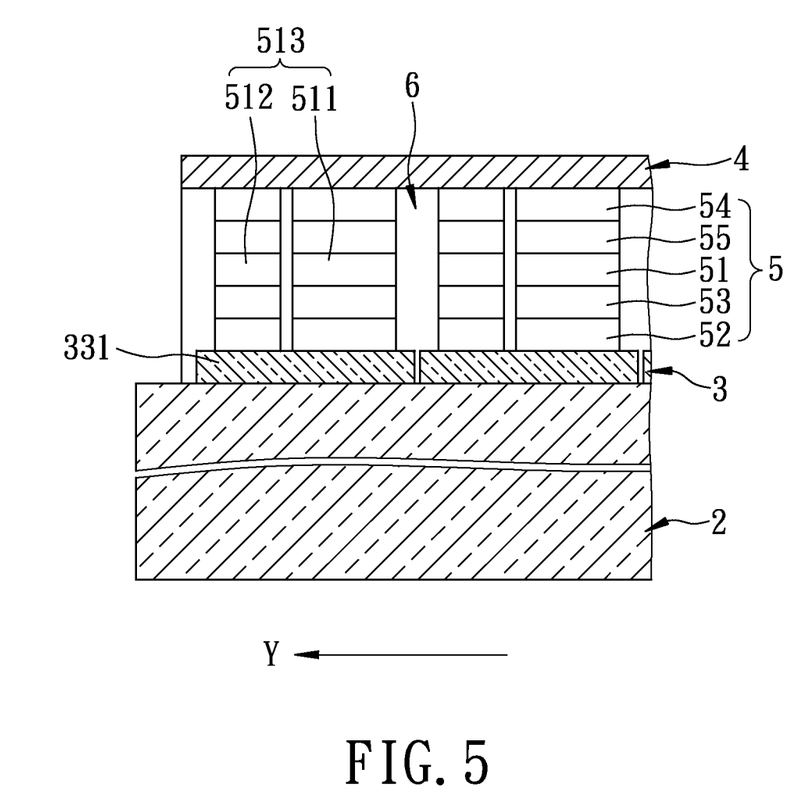
FIG. 5 is a fragmentary sectional view of the second preferred embodiment.

Referring to FIGS. 4 and 5, the second preferred embodiment of the OLED illuminating device according to the present invention is shown to have a structure similar to that of the first preferred embodiment. The differences between the first and second preferred embodiments reside in the number of the electrode zones 331 of the patterned transparent conductive layer 33, and the correspondence between the blue and yellow light emitting zones 511 and 512 of the patterned organic light emitting layer 51 and the electrode zones 331 of the patterned transparent conductive layer 33.

In the second preferred embodiment of the OLED illuminating device, the number of the electrode zones 331 is one half of the total number of the blue light emitting zones 511 and the yellow light emitting zones 512. Each of the electrode zones 331 has opposite first and second sides 333 and 334 along the row direction X of the 2-D array. The first sides 333 of the electrode zones 331 are electrically coupled to an adjacent one of the secondary bus lines 32. Each of the blue light emitting zones 511 of the patterned organic light emitting layer 51 cooperates with an adjacent one of the yellow light emitting zones 512 in the column direction Y to form a mixed light emitting zone 513 that is electrically coupled to a corresponding one of the electrode zones 331 of the transparent conductive layer 33. The second preferred embodiment has the same advantages as those of the first preferred embodiment.

Figure 6:
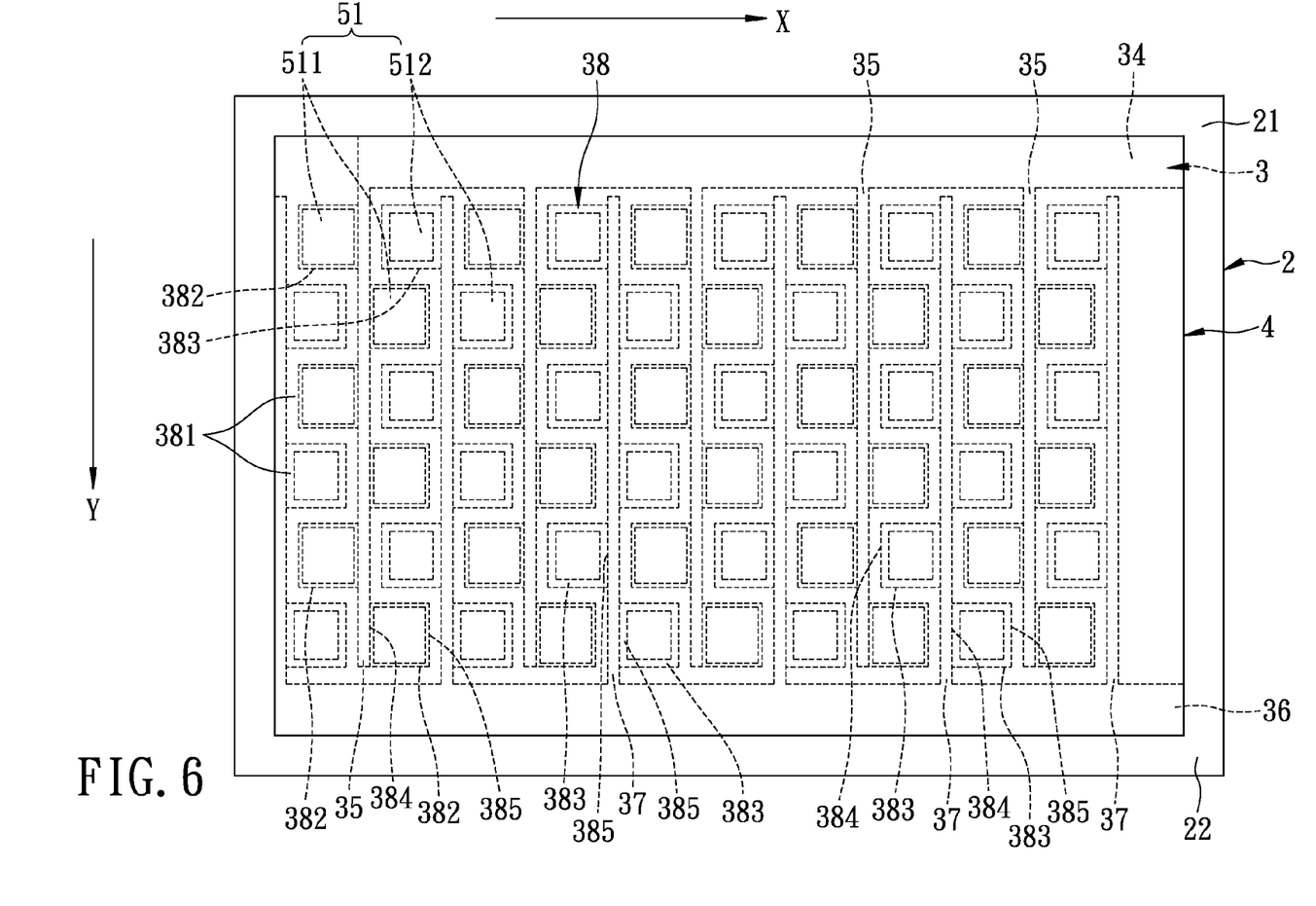
FIG. 6 is a schematic top view of the third preferred embodiment of the OLED illuminating device.

Referring to FIG. 6, a third preferred embodiment of the OLED illuminating device according to the present invention is shown to have a structure similar to that of the first preferred embodiment. The difference between the first and third preferred embodiments resides in the configuration of the first electrode unit 3.

The first electrode unit 3 of the third preferred embodiment includes a first primary bus line 34, a plurality of first secondary bus lines 35, a second primary bus line 36, a plurality of second secondary bus lines 37, and a patterned transparent conductive layer 38. The first primary bus line 34 is formed on the first side portion 21 of the substrate 2, and the second primary bus line 36 is formed on the second side portion 22 of the substrate 2. The first secondary bus lines 35 are electrically connected to the first primary bus line 34, extend from the first primary bus line 34 toward the second primary bus line 36 along the column direction Y of the 2-D array, and are spaced apart from each other. The second secondary bus lines 37 are electrically connected to the second primary bus line 36, extend from the second primary bus line 36 toward the first primary bus line 34 along the column direction Y of the 2-D array, and are spaced apart from each other. The first secondary bus lines 35 and the second secondary bus lines 37 are alternately arranged along the row direction X of the 2-D array and are electrically insulated from each other. The patterned transparent conductive layer 38 has a plurality of groups of electrode zones 381 each of which has opposite first and second sides 384 and 385 along the row direction X of the 2-D array. Each of the groups of the electrode zones 381 includes a plurality of first electrode zones 382 and a plurality of second electrode zones 383 that are alternately arranged along the column direction Y. The electrode zones 381 electrically connect the blue light emitting zones 511 and the yellow light emitting zones 512 of the patterned organic light emitting layer 51 to the first secondary bus lines 35 and the second secondary bus lines 37. To be more specific, the first sides 384 of the first electrode zones 382 are electrically coupled to an adjacent one of the first secondary bus lines 35, and the second sides 385 of the second electrode zones 383 are electrically coupled to an adjacent one of the second secondary bus lines 37. The first electrode zones 382 of the patterned transparent conductive layer 38 are respectively coupled to the blue light emitting zones 511 of the patterned organic light emitting layer 51, and the second electrode zones 383 of the patterned transparent conductive layer 38 are respectively coupled to the yellow light emitting zones 512 of the patterned organic light emitting layer 51.

The third preferred embodiment of the OLED illuminating device has advantages similar to those of the first preferred embodiment. In addition, it should be noted that the input currents of the blue light emitting zones 511 and the yellow light emitting zones 512 in this preferred embodiment may be controlled separately using the first secondary bus lines 35 which are electrically connected to the first primary bus line 34, and the second secondary bus lines 37 which are electrically connected to the second primary bus line 36, so as to adjust the brightness of the blue light emitting zones 511 and the yellow light emitting zones 512 separately and to obtain different chromaticity of the OLED illuminating device according to the present invention. For example, when a warmer light source is needed, the input current of the second primary bus line 36 may be raised to increase the brightness of light emitted from the yellow light emitting zones 512 of the patterned organic light emitting layer 51, so as to achieve the warmer illuminating light from the OLED illuminating device.

Figure 7:
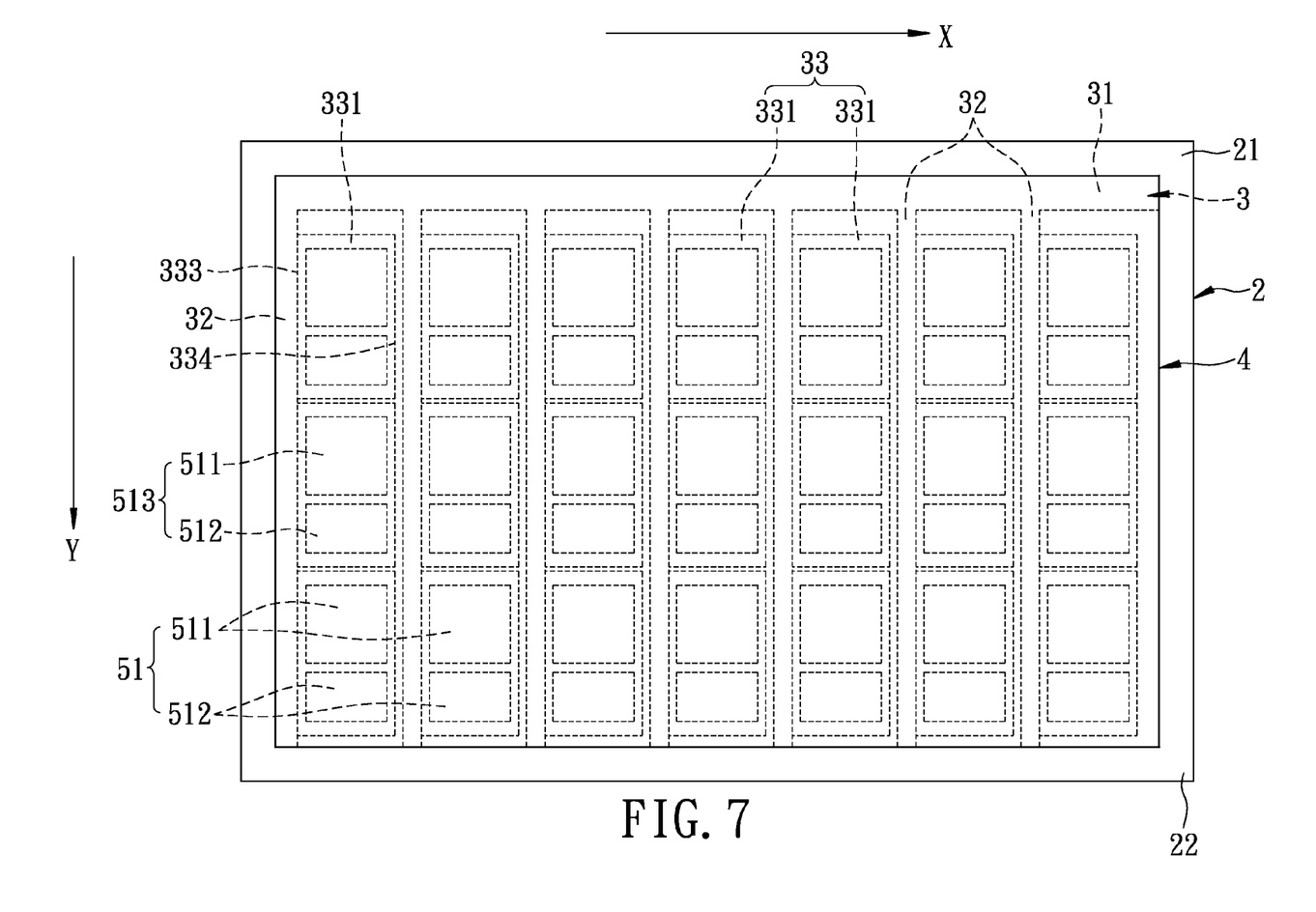
FIG. 7 is a schematic top view of the fourth preferred embodiment of the OLED illuminating device.

Referring to FIG. 7, the fourth preferred embodiment of the OLED illuminating device is shown to have a structure similar to that of the second preferred embodiment. The differences between the second and fourth preferred embodiments reside in the arrangement of the blue light emitting zones 511 and the yellow light emitting zones 512, and the correspondence between the electrodes 331 of the transparent conductive layer 33 and the blue and yellow light emitting zones 511 and 512 of the patterned organic light emitting layer 51.

In the fourth preferred embodiment, the blue light emitting zones 511 and the yellow light emitting zones 512 are arranged in alternating rows in the 2-D array, and each of the blue light emitting zones 511 cooperates with an adjacent one of the yellow light emitting zones 512 in the column direction Y to form a mixed light emitting zone 513 that is electrically coupled to a corresponding one of the electrode zones 331 of the transparent conductive layer 33. Each of the electrode zones 331 has opposite first and second sides 333 and 334 along the row direction X of the 2-D array, and the first sides 333 of the electrode zones 331 are electrically coupled to an adjacent one of the secondary bus lines 32. In this preferred embodiment, the ratio between the projected area of each of the blue light emitting zones 511 and that of each of the yellow light emitting zones 512 is 1.3:1. The fourth preferred embodiment has the same advantages as those in the first preferred embodiment.

COMPARATIVE EXAMPLE

A comparative example of the OLED illuminating device has a substantially similar structure to that of the fourth preferred embodiment. The difference between the comparative example and the fourth preferred embodiment resides in that the ratio between the area of each of the blue light emitting zones 511 and that of each of the yellow light emitting zones 512 is 1:1.

<Chromatic Analysis>

The comparative example and the fourth preferred embodiment of the OLED illuminating device were operated at 25° C. and subjected to chromatic analysis. The initial CIE 1931 coordinates of the comparative example were at CIE 1931 (0.321, 0.314). After continuous 1790 hours of illuminating, the CIE 1931 coordinates thereof shifted to CIE 1931 (0.414, 0.382). On the other hand, the initial CIE 1931 coordinates of the fourth preferred embodiment were at CIE 1931 (0.310, 0.315), and shifted to CIE 1931 (0.378, 0.358) after continuous 1830 hours of illuminating. The chromatic shifts of the fourth preferred embodiment and the comparative example are shown separately in FIGS. 8 and 9 with respect to the illuminating time.

Figure 8:
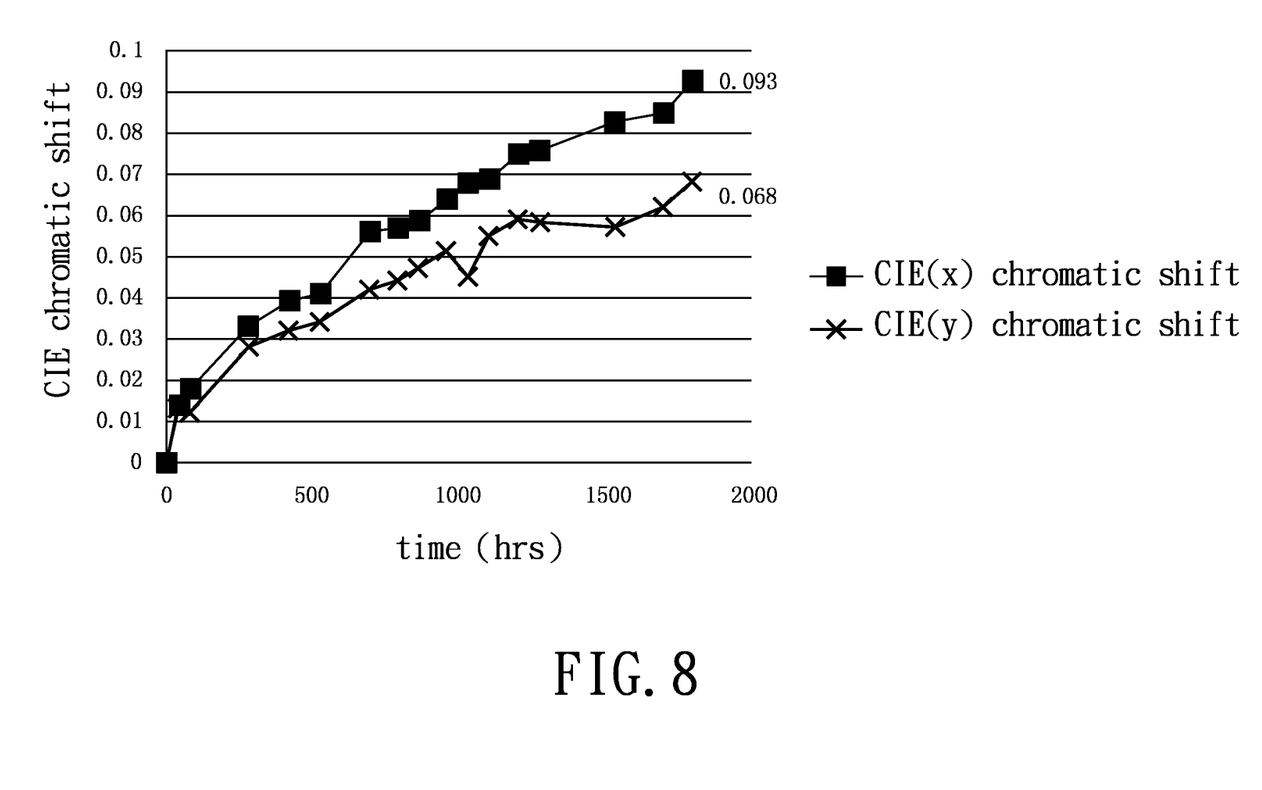
FIG. 8 is a graph illustrating chromatic shift of a comparative example of the OLED illuminating device with respect to time.
Figure 9:
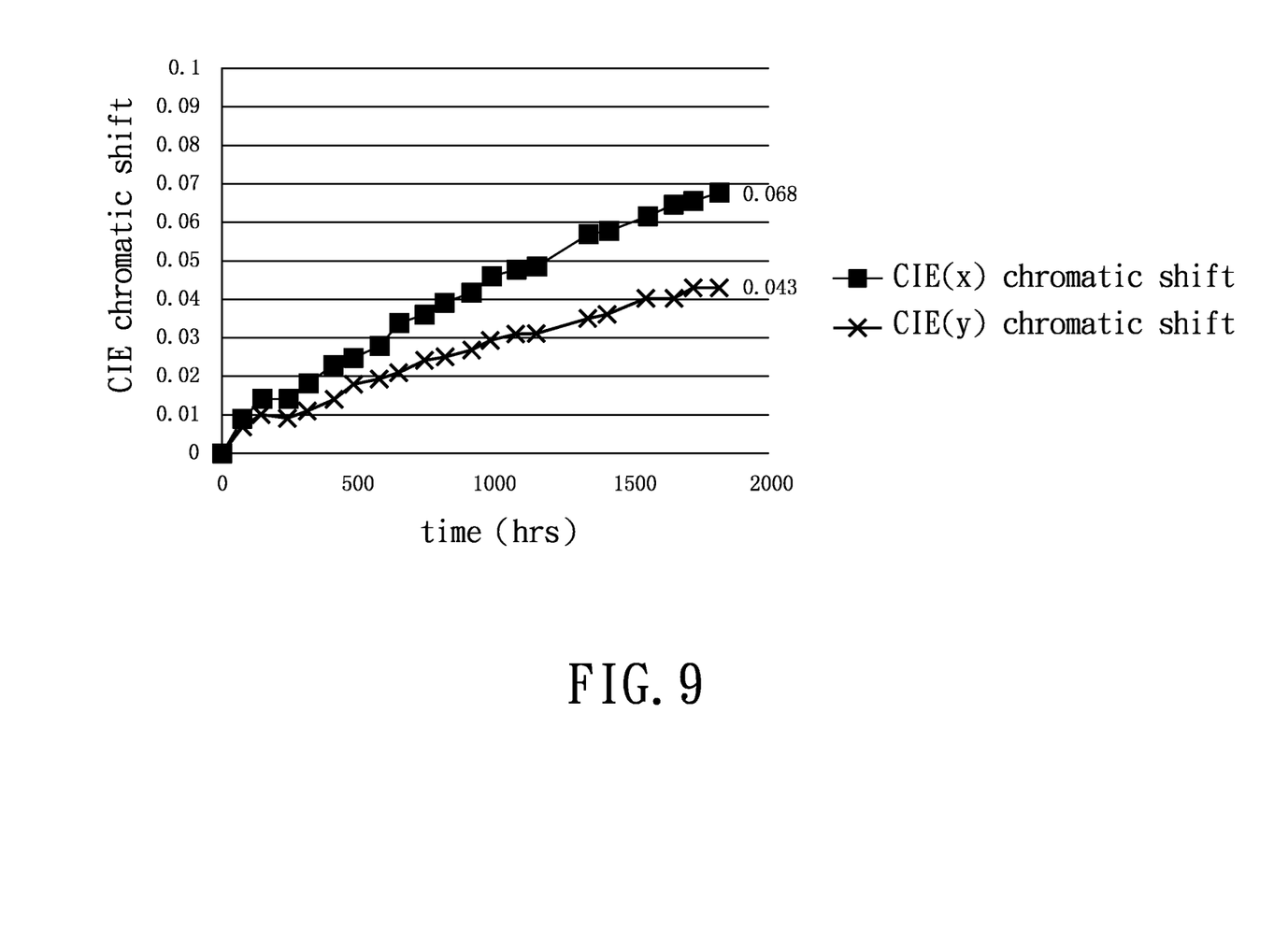
FIG. 9 is a graph illustrating chromatic shift of the fourth preferred embodiment with respect to time.

As shown in FIG. 8, the chromatic shift of the comparative example increased by 0.093 in CIE(x) and by 0.068 in CIE(y) after the 1790 illuminating hours. As shown in FIG. 9, the chromatic shift of the fourth embodiment of the OLED illuminating device increased by 0.068 in CIE(x) and by 0.043 in CIE(y) after the 1830 illuminating hours. This indicates that the chromatic shift of the fourth preferred embodiment has improved by 27% in CIE(x) and by 37% in CIE(y) in comparison to the comparative example.

To sum up, the arrangement of the blue light emitting zones 511 and yellow light emitting zones 512 of the OLED illuminating device according to the present invention reduces the overall thickness so as to improve the production yield and to lower the production cost. Further, the larger projected area of the blue light emitting zones 511 of the patterned organic light emitting layer 51 results in lower current density thereof during operation, so as to lengthen the service life of the blue light emitting zones 511 and to alleviate the chromatic shift problem of the OLED illuminating device after working for a long period of time. Furthermore, the input currents of the blue light emitting zones 511 and the yellow light emitting zones 512 are capable of being controlled separately using the first primary bus line 34 and the second primary bus line 36 in embodiments of this invention so as to adjust the chromaticity of illuminated light from the OLED illuminating device of the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An organic light emitting diode (OLED) illuminating device comprising:
   a substrate;
   a first electrode unit disposed on said substrate;
   a light emitting structure disposed on said first electrode unit; and
   a second electrode unit disposed on said light emitting structure;
   wherein said light emitting structure includes a patterned organic light emitting layer having plurality of blue light emitting zones and yellow light emitting zones that are spaced apart from each other, that are arranged on the same plane and that are electrically insulated from each other, a projected area occupied by said blue light emitting zones on said substrate being larger than that occupied by said yellow light emitting zones on said substrate.

2. The OLED illuminating device as claimed in claim 1, wherein said blue light emitting zones and said yellow light emitting zones of said patterned organic light emitting layer are arranged in a two-dimensional (2-D) array.

3. The OLED illuminating device as claimed in claim 2, wherein said blue light emitting zones and said yellow light emitting zones are arranged alternately in a checkerboard pattern.

4. The OLED illuminating device as claimed in claim 3, wherein said substrate has a first side portion and a second side portion opposite to each other, said first electrode unit including a primary bus line formed on said first side portion of said substrate, a plurality of secondary bus lines that are electrically connected to said primary bus line, that extend from said primary bus line toward said second side portion of said substrate along a column direction of the 2-D array, and that are spaced apart from each other along a row direction of the 2-D array, and a patterned transparent conductive layer having a plurality of groups of electrode zones that electrically connect said blue light emitting zones and said yellow light emitting zones of said patterned organic light emitting layer to said secondary bus lines, said electrode zones in each of the groups being arranged in the column direction between a corresponding adjacent pair of said secondary bus lines and being spaced apart from each other.

5. The OLED illuminating device as claimed in claim 4, wherein each of the groups of said electrode zones includes a plurality of first electrode zones and a plurality of second electrode zones that are alternately arranged along the column direction, said first electrode zones being electrically coupled to one of said secondary bus lines in the corresponding adjacent pair, said second electrode zones being electrically coupled to the other one of said secondary bus lines in the corresponding adjacent pair.

6. The OLED illuminating device as claimed in claim 4, wherein each of said electrode zones has opposite first and second sides along the row direction of the 2-D array, said first sides of said electrode zones being electrically coupled to an adjacent one of said secondary bus lines, each of said blue light emitting zones of said patterned organic light emitting layer cooperating with an adjacent one of said yellow light emitting zones in the column direction to form a mixed light emitting zone that is electrically coupled to a corresponding one of said electrode zones of said transparent conductive layer.

7. The OLED illuminating device as claimed in claim 3, wherein said substrate has a first side portion and a second side portion opposite to each other, said first electrode unit including a first primary bus line formed on said first side portion of said substrate, and a second primary bus line formed on said second side portion of said substrate, a plurality of first secondary bus lines that are electrically connected to said first primary bus line, that extend from said first primary bus line toward said second primary bus line along a column direction of the 2-D array, and that are spaced apart from each other, a plurality of second secondary bus lines that are electrically connected to said second primary bus line, that extend from said second primary bus line toward said first primary bus line along the column direction of the 2-D array, and that are spaced apart from each other, said first secondary bus lines and said second secondary bus lines being alternately arranged along a row direction of the 2-D array and being electrically insulated from each other, and a patterned transparent conductive layer having a plurality of groups of electrode zones that electrically connect said blue light emitting zones and said yellow light emitting zones of said patterned organic light emitting layer to said first secondary bus lines and said second secondary bus lines, said electrode zones in each of the groups being arranged in the column direction between a corresponding adjacent pair of said first secondary bus lines and said second secondary bus lines.

8. The OLED illuminating device as claimed in claim 7, wherein each of said electrode zones has opposite first and second sides along the row direction of the 2-D array, each of the groups of said electrode zones including a plurality of first electrode zones and a plurality of second electrode zones that are alternately arranged along the column direction, said first sides of said first electrode zones being electrically coupled to an adjacent one of said first secondary bus lines, said second sides of said second electrode zones being electrically coupled to an adjacent one of said second secondary bus lines, said first electrode zones of said patterned transparent conductive layer being respectively coupled to said blue light emitting zones of said patterned organic light emitting layer, said second electrode zones of said patterned transparent conductive layer being respectively coupled to said yellow light emitting zones of said patterned organic light emitting layer.

9. The OLED illuminating device as claimed in claim 2, wherein said blue light emitting zones and said yellow light emitting zones are arranged in alternating rows in the 2-D array.

10. The OLED illuminating device as claimed in claim 9, wherein said substrate has a first side portion and a second side portion opposite to each other, said first electrode unit including a primary bus line formed on said first side portion of said substrate, a plurality of secondary bus lines that are electrically connected to said primary bus line, that extend from said primary bus line toward said second side portion of said substrate along a column direction of the 2-D array, and that are spaced apart from each other along a row direction of the 2-D array, and a patterned transparent conductive layer having a plurality of groups of electrode zones that electrically connect said blue light emitting zones and said yellow light emitting zones of said patterned organic light emitting layer to said secondary bus lines, said electrode zones in each of the groups being arranged in the column direction between a corresponding adjacent pair of said secondary bus lines and being spaced apart from each other.

11. The OLED illuminating device as claimed in claim 10, wherein each of said electrode zones has opposite first and second sides along the row direction of the 2-D array, said first sides of said electrode zones being electrically coupled to an adjacent one of said secondary bus lines, each of said blue light emitting zones of said patterned organic light emitting layer cooperating with an adjacent one of said yellow light emitting zones in the column direction to form a mixed light emitting zone that is electrically coupled to a corresponding one of said electrode zones of said transparent conductive layer.

12. The OLED illuminating device as claimed in claim 1, wherein said light emitting structure further includes a patterned hole injection layer disposed between said first electrode unit and said patterned organic light emitting layer, a patterned hole transfer layer disposed between said patterned hole injection layer and said patterned organic light emitting layer, a patterned electron injection layer disposed between said second electrode unit and said patterned organic light emitting layer, and a patterned electron transfer layer disposed between said patterned electron injection layer and said patterned organic light emitting layer, said patterned organic light emitting layer, said patterned hole injection layer, said patterned hole transfer layer, said patterned electron injection layer, and said patterned electron transfer layer having mutually corresponding patterns.

13. The OLED illuminating device as claimed in claim 1, wherein a projected area occupied by each of said blue light emitting zones on said substrate being larger than that occupied by each of said yellow light emitting zones on said substrate.

* * * * *